United States Patent
Wu et al.

(10) Patent No.: US 9,481,803 B2
(45) Date of Patent: *Nov. 1, 2016

(54) WATER DISPERSIBLE PHASE CHANGE INK SUITABLE FOR USE AS A PHOTO-MASK

(71) Applicant: Xerox Corporation, Norwalk, CT (US)

(72) Inventors: Bo Wu, Wilsonville, OR (US); Jule W. Thomas, Jr., West Linn, OR (US)

(73) Assignee: Xerox Corporation, Norwalk, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/569,678

(22) Filed: Dec. 13, 2014

(65) Prior Publication Data

US 2016/0168403 A1    Jun. 16, 2016

(51) Int. Cl.

| C09D 11/34 | (2014.01) |
|---|---|
| C09D 11/328 | (2014.01) |
| G03F 7/20 | (2006.01) |
| C08K 5/17 | (2006.01) |
| G03F 7/30 | (2006.01) |
| C09D 11/12 | (2006.01) |
| C09D 11/38 | (2014.01) |
| C09D 11/50 | (2014.01) |

(52) U.S. Cl.
CPC ............... C09D 11/328 (2013.01); C08K 5/17 (2013.01); C09D 11/12 (2013.01); C09D 11/34 (2013.01); C09D 11/38 (2013.01); C09D 11/50 (2013.01); G03F 7/20 (2013.01); G03F 7/30 (2013.01)

(58) Field of Classification Search
CPC .................................................... C09D 11/34
See application file for complete search history.

(56) References Cited

U.S. PATENT DOCUMENTS

| 5,195,430 A | 3/1993 | Rise |
| 5,389,958 A | 2/1995 | Bui et al. |
| 6,590,082 B1 | 7/2003 | Banning et al. |
| 6,858,070 B1 | 2/2005 | Wong et al. |
| 6,860,930 B2 | 3/2005 | Wu et al. |
| 7,294,730 B2 | 11/2007 | Banning et al. |
| 7,973,186 B1 | 7/2011 | Goredema et al. |
| 2007/0119338 A1* | 5/2007 | Breton .................. C09D 7/1241 106/31.29 |
| 2010/0313788 A1* | 12/2010 | Drappel ................. C09D 11/34 106/31.29 |

OTHER PUBLICATIONS

Océ TonerPearls® Material Safety Data Sheet, 2 pages, May 2008.
Bo Wu, et al., U.S. Appl. No. 14/569,675, filed Dec. 13, 2014, "White Phase Change Ink Composition," not yet published.
Bo Wu, et al., U.S. Appl. No. 14/569,679, filed Dec. 13, 2014, "Phase Change Ink for Ophthalmic Lens Marking," not yet published.
Bo Wu, et al., U.S. Appl. No. 14/569,676, filed Dec. 13, 2014, "Water Cleanable Phase Change Ink for Ophthalmic Lens Marking," not yet published.

* cited by examiner

*Primary Examiner* — Veronica F Faison
(74) *Attorney, Agent, or Firm* — Marylou J. Lavoie, Esq. LLC

(57) ABSTRACT

A water dispersible phase change ink composition including a hydrophilic wax having at least one ethoxyl moiety; a low viscosity wax having at least one hydroxyl group, wherein the low viscosity wax is miscible with the hydrophilic wax; an optional stabilizer; and a colorant, wherein the colorant is selected to absorb light in a region that one wants to block. An ink jet printer stick or pellet comprising the water dispersible phase change ink composition. A process for forming a photo-imaged stencil using the water dispersible phase change ink composition.

20 Claims, No Drawings

WATER DISPERSIBLE PHASE CHANGE INK SUITABLE FOR USE AS A PHOTO-MASK

TECHNICAL FIELD

Described herein is a water dispersible phase change ink composition suitable for use as a photo-mask such as an ultra violet mask. More particularly described is a water dispersible phase change ink comprising a hydrophilic wax having at least one ethoxyl moiety; a low viscosity wax having at least one hydroxyl group, wherein the low viscosity wax is miscible with the hydrophilic wax; an optional stabilizer; and a colorant, wherein the colorant is selected to absorb light in a region that one wants to block.

BACKGROUND

Disclosed herein is a water dispersible phase change ink suitable for use as photo-mask, in embodiments, a UV (ultra violet) blocking mask.

The commercial screen printing industry uses photo-imaged stencils for screen printing. The imaged stencils are prepared by using imaged film comprising a transparent film having images disposed thereon which are generated by printing, copying, or drawing with inks which can block UV light. The imaged film is disposed over a photo-sensitive emulsion layer on a screen, and exposed to UV radiation. After UV exposure, the imaged film is removed and the emulsion of the blocked area is washed away, producing photo-imaged stencils that can be used for screen printing.

A need remains for an improved method and improved materials for preparing photo-imaging stencils or masks.

Throughout this application, various publications, patents, and published patent applications are referred to by an identifying citation. The disclosures of the publications, patents, and published patent applications referenced in this application are hereby incorporated by reference into the present disclosure to more fully describe the state of the art to which this invention pertains.

SUMMARY

Described is a water dispersible phase change ink composition comprising a hydrophilic wax having at least one ethoxyl moiety; a low viscosity wax having at least one hydroxyl group, wherein the low viscosity wax is miscible with the hydrophilic wax; an optional stabilizer; and a colorant, wherein the colorant is selected to absorb light in a region that one wants to block.

Also described is an ink jet printer stick or pellet comprising a water dispersible phase change ink composition, wherein the phase change ink composition comprises a hydrophilic wax having at least one ethoxyl moiety; a low viscosity wax having at least one hydroxyl group, wherein the low viscosity wax is miscible with the hydrophilic wax; an optional stabilizer, wherein the optional stabilizer, if present, is selected from the group consisting of aromatic amine, hindered amine, phenol, and mixtures and combinations thereof; and a colorant, wherein the colorant is selected to absorb light in a region that one wants to block.

Also described is a process comprising disposing a water dispersible phase change ink composition onto a photo-sensitive emulsion film that is disposed on a screen to form a mask; wherein the water dispersible phase change ink composition comprises a hydrophilic wax having at least one ethoxyl moiety; a low viscosity wax having at least one hydroxyl group, wherein the low viscosity wax is miscible with the hydrophilic wax; an optional stabilizer, and a colorant, wherein the colorant is selected to absorb light in a region that one wants to block; exposing the mask to radiation to form a stencil; and washing with water to remove the mask, leaving the photo-imaged stencil.

DETAILED DESCRIPTION

A water dispersible phase change ink composition is provided which is particularly suitable for producing photo-imaged stencils by replacing imaged film with digital images printed with the water dispersible phase change ink of the present disclosure on an emulsion layer. The ink composition has sufficient UV blocking capability and water solubility or dispersibility which enables printing the water dispersible phase change ink composition onto a photo-sensitive emulsion film that is disposed on a screen to form a UV mask; exposing the printed ink to UV radiation to form a stencil; washing with water to remove the UV mask leaving the photo-imaged stencil. So, instead of the user having to print film on a separate printer, line up on screen, then expose, one can print the digital film directly on the screen.

Thus, a water dispersible phase change ink composition is provided which is particularly suitable for use as a UV mask. In embodiments, the water dispersible phase change ink composition provides improved jetting reliability, improved durability of the printed, printed images which can function as UV masks, and good optical contrast. The water dispersible phase change ink compositions provide printed images on an emulsion layer that can be readily removed irradiation with water as desired. In embodiments, the water dispersible phase change ink composition is a water cleanable ink; that is, images printed with the water dispersible phase change ink composition can be removed with water.

In embodiments, a water dispersible phase change ink composition for comprises a hydrophilic wax having at least one ethoxyl moiety; a low viscosity wax having at least one hydroxyl group, wherein the low viscosity wax is miscible with the hydrophilic wax; an optional stabilizer; and a colorant, wherein the colorant is selected to absorb light in a region that one wants to block. In embodiments, the colorant imparts absorption in the visible range. In other embodiments, the colorant imparts absorption in the ultra-violet (UV) range.

In embodiments, an ink jet printer stick or pellet is provided comprising a water dispersible phase change ink composition comprising a hydrophilic wax having at least one ethoxyl moiety; a low viscosity wax having at least one hydroxyl group, wherein the low viscosity wax is miscible with the hydrophilic wax; an optional stabilizer, wherein the optional stabilizer, if present, is selected from the group consisting of hindered amines, phenols, and mixtures and combinations thereof; and a colorant.

When used herein, a hydrophilic wax having at least one ethoxyl moiety means that the hydrophilic wax has at least one group of the formula

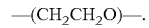

When used herein, a low viscosity wax having at least one hydroxyl group means that the low viscosity wax has at least one group of the formula

In certain embodiments, water cleanable solid inks, in embodiments, black inks, are provided and are particularly suitable for use in screen printing applications. The water dispersible phase change ink comprises a hydrophilic wax with ethoxyl moiety which provides the ink with the characteristic of providing printed images that are readily cleaned or removed by water. In embodiments, low viscosity wax is selected as a viscosity modifier. The low viscosity wax has a hydroxyl group to provide miscibility with the hydrophilic wax. In embodiments, a stabilizer is included in the ink. The stabilizer provides good thermal stability by preventing oxidation of the hydroxyl group and possible thermal degradation of the ethoxyl moiety.

The water dispersible phase change ink composition is water dispersible at ambient temperature. The water dispersible phase change ink composition can be successfully jetted on to an emulsion layer to form a blocked area or mask, irradiated, and then removed by washing away with water, thus leaving a photo-imaged stencil. The images formed are durable, have sufficient blocking power for the light in the desired wavelength, such as UV or visible range, and are easily removed with water. The water dispersible phase change ink composition exhibits good thermal stability of ink viscosity over time and good jetting performance.

The water dispersible phase change ink composition includes a hydrophilic wax having at least one ethoxyl moiety. Any suitable or desired hydrophilic wax can be selected in embodiments herein. In embodiments, the hydrophilic wax is selected from the group consisting of ethoxylated hydrocarbon wax, such as Unithox® waxes available from Baker Petrolite, ethoxylated alcohol, and mixtures and combinations thereof.

In embodiments, the hydrophilic wax is an ethoxylated alcohol, such as available from Petrolite and of the general formula

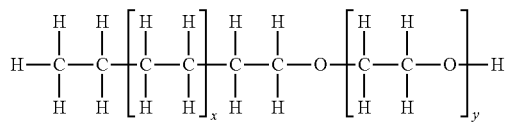

wherein x is an integer of from about 1 to about 50, such as from about 5 to about 40 or from about 11 to about 24 and y is an integer of from about 1 to about 70, such as from about 1 to about 50 or from about 1 to about 40. The materials may have a melting point of from about 60° C. to about 150° C., such as from about 70° C. to about 120° C. or from about 80° C. to about 110° C. and a molecular weight (Mn) range of from about 100 to about 5,000, such as from about 500 to about 3,000 or from about 500 to about 2,500. Commercial examples include UNITHOX 420 (Mn=560), UNITHOX 450 (Mn=900), UNITHOX 480 (Mn=2,250), UNITHOX 520 (Mn=700), UNITHOX 550 (Mn=1,100), UNITHOX 720 (Mn=875), UNITHOX 750 (Mn=1,400), and the like.

The hydrophilic wax can be present in the phase change ink composition in any suitable or desired amount. In embodiments, the hydrophilic wax is present in an amount of from about 10 to about 90 percent by weight, or from about 20 to about 80 percent by weight, or from about 25 to about 70 percent by weight, based upon the total weight of the phase change ink composition.

The water dispersible phase change ink composition includes a low viscosity wax having at least one hydroxyl group, wherein the low viscosity wax is miscible with the hydrophilic wax. Any suitable or desired low viscosity wax can be selected in embodiments herein. In embodiments, the low viscosity wax is a wax having a viscosity of from about 1 to about 15, or from about 2 to about 13, or from about 3 to about 10 centipoise, at a temperature in the range of from about 80 to about 120° C. In embodiments, the low viscosity wax is selected from the group consisting of stearyl alcohol, behenyl alcohol, and mixtures and combinations thereof.

The low viscosity wax can be present in the phase change ink composition in any suitable or desired amount. In embodiments, the low viscosity wax is present in an amount of from about 15 to about 75 percent by weight, or from about 20 to about 60 percent by weight, or from about 25 to about 50 percent by weight, based upon the total weight of the phase change ink composition.

In embodiments, the combined total amount of all wax present in the phase change, including both the hydrophilic wax and the low viscosity wax along with any additional optional other wax, is from about 15 to about 75 percent by weight, or from about 20 to about 70 percent by weight, or from about 25 to about 60 percent by weight, based upon the total weight of the phase change ink composition.

The water dispersible phase change ink composition can further comprise a stabilizer. Any suitable or desired stabilizer can be selected in embodiments herein. In embodiments, the stabilizer is selected from the group consisting of hindered amines, phenols, an aromatic amine antioxidant stabilizer, and mixtures and combinations thereof.

The stabilizer can be present in the phase change ink composition in any suitable or desired amount. In embodiments, the stabilizer is present in an amount of from about 0.05 to about 10 percent by weight, or from about 0.1 to about 7 percent by weight, or from about 0.2 to about 3 percent by weight, based upon the total weight of the phase change ink composition.

The ink may further include conventional additives to take advantage of the known functionality associated with such conventional additives. Such additives may include, for example, at least one antioxidant, defoamer, slip and leveling agents, clarifier, viscosity modifier, adhesive, plasticizer and the like. In embodiments, the phase change ink composition includes a member of the group consisting of plasticizer, stabilizer, antioxidant, defoamer, slip and leveling agents, clarifier, viscosity modifier, adhesive, and mixtures and combinations thereof.

The ink may optionally contain antioxidants to protect the images from oxidation and also may protect the ink components from oxidation while existing as a heated melt in the ink reservoir. Examples of suitable antioxidants include N,N'-hexamethylene bis(3,5-di-tert-butyl-4-hydroxy hydrocinnamamide) (IRGANOX® 1098, available from BASF); 2,2-bis(4-(2-(3,5-di-tert-butyl-4-hydroxyhydrocinnamoyloxy)) ethoxyphenyl)propane (TOPANOL-205, available from Vertellus); tris(4-tert-butyl-3-hydroxy-2,6-dimethyl benzyl)isocyanurate (Aldrich); 2,2'-ethylidene bis(4,6-di-tert-butylphenyl)fluoro phosphonite (ETHANOX® 398, available from Albermarle Corporation); tetrakis(2,4-di-tert-butylphenyl)-4,4'-biphenyl diphosphonite (Aldrich); pentaerythritol tetrastearate (TCI America); tributylammonium hypophosphite (Aldrich); 2,6-di-tert-butyl-4-methoxyphenol (Aldrich); 2,4-di-tert-butyl-6-(4-methoxybenzyl)phenol (Aldrich); 4-bromo-2,6-dimethylphenol (Aldrich); 4-bromo-3,5-didimethylphenol (Aldrich); 4-bromo-2-nitrophenol (Aldrich); 4-(diethyl aminomethyl)-2,5-dimethylphenol (Aldrich); 3-dimethylaminophenol (Aldrich); 2-amino-4-tert-amylphenol (Aldrich); 2,6-bis(hydroxymethyl)-p-cresol (Aldrich); 2,2'-methylenediphenol (Aldrich); 5-(diethylamino)-2-nitrosophenol (Aldrich); 2,6-dichloro-4-fluorophenol (Aldrich); 2,6-dibromo fluoro phenol (Aldrich); α-trifluoro-o-cresol (Aldrich); 2-bromo-4-fluorophenol (Aldrich); 4-fluorophenol (Aldrich); 4-chlorophenyl-2-chloro-1,1,2-tri-fluoroethyl sulfone (Aldrich); 3,4-difluoro phenylacetic acid (Aldrich); 3-fluorophenyl acetic acid (Aldrich); 3,5-difluoro phenylacetic acid (Aldrich); 2-fluorophenylacetic acid (Aldrich); 2,5-bis (trifluoromethyl) benzoic acid (Aldrich); ethyl-2-(4-(4-(trifluoromethyl)phenoxy) phenoxy)propionate (Aldrich); tetrakis (2,4-di-tert-butyl phenyl)-4,4'-biphenyl diphosphonite (Aldrich); 4-tert-amyl phenol (Aldrich); 3-(2H-benzotriazol-2-yl)-4-hydroxy phenethylalcohol (Aldrich); NAUGARD® 76, NAUGARD® 445, NAUGARD® 512, and NAUGARD® 524 (manufactured by Chemtura Corporation); and the like, as well as mixtures thereof. The antioxidant, when present, may be present in the ink in any desired or effective amount, such as from about 0.25 percent to about 10 percent by weight of the ink or from about 1 percent to about 5 percent by weight of the ink.

The water dispersible phase change ink composition can further comprise a colorant. Any suitable or desired colorant including dyes, pigments, and mixtures and combinations thereof can be selected. In embodiments, the colorant is selected from the group consisting of dyes, pigments, and mixtures and combinations thereof. In specific embodiments, the colorant is a dye. In other embodiments, the colorant is a pigment. In certain embodiments, the colorant is a black dye.

The phase change ink composition herein provides a UV or visible light mask. The colorant herein is selected to absorb the light of the wavelength or region that one wants to block. Thus, the water dispersible phase change ink composition forms an ultra violet mask. In embodiments, the colorant is selected for its ability to impart absorption to the phase change ink composition in a desired wavelength. In embodiments, the colorant is selected to impart absorption in the UV range. In embodiments, the colorant is a black dye imparting UV absorption. Thus, in embodiments, the colorant is a black dye selected to absorb light in the ultra violet range.

Any desired or effective colorant can be employed in the inks, including dyes, pigments, mixtures thereof, and the like, provided that the colorant can be dissolved or dispersed in the ink vehicle. The compositions can be used in combination with conventional ink colorant materials, such as Color Index (C.I.) Solvent Dyes, Disperse Dyes, modified Acid and Direct Dyes, Basic Dyes, Sulphur Dyes, Vat Dyes, and the like.

Examples of suitable dyes include Neozapon® Red 492 (BASF); Orasol® Red G (Pylam Products); Direct Brilliant Pink B (Oriental Giant Dyes); Direct Red 3BL (Classic Dyestuffs); Supranol® Brilliant Red 3BW (Bayer AG); Lemon Yellow 6G (United Chemie); Light Fast Yellow 3G (Shaanxi); Aizen Spilon Yellow C-GNH (Hodogaya Chemical); Bemachrome Yellow GD Sub (Classic Dyestuffs); Cartasol® Brilliant Yellow 4GF (Clariant); Cibanone Yellow 2G (Classic Dyestuffs); Orasol® Black RLI (BASF); Orasol® Black CN (Pylam Products); Savinyl Black RLSN (Clariant); Pyrazol Black BG (Clariant); Morfast® Black 101 (Rohm & Haas); Diaazol Black RN (ICI); Thermoplast® Blue 670 (BASF); Orasol® Blue GN (Pylam Products); Savinyl Blue GLS (Clariant); Luxol Fast Blue MBSN (Pylam Products); Sevron Blue 5GMF (Classic Dyestuffs); Basacid® Blue 750 (BASF); Keyplast Blue (Keystone Aniline Corporation); Neozapon® Black X51 (BASF); Classic Solvent Black 7 (Classic Dyestuffs); Sudan Blue 670 (C.I. 61554) (BASF); Sudan Yellow 146 (C.I. 12700) (BASF); Sudan Red 462 (C.I. 26050) (BASF); C.I. Disperse Yellow 238; Neptune Red Base NB543 (BASF, C.I. Solvent Red 49); Neopen® Blue FF-4012 (BASF); Fastol® Black BR (C.I. Solvent Black 35) (Chemische Fabriek Triade BV); Morton Morplas Magenta 36 (C.I. Solvent Red 172); metal phthalocyanine colorants, such as those disclosed in U.S. Pat. No. 6,221,137, the disclosure of which is totally incorporated herein by reference, and the like. Polymeric dyes can also be used, such as those disclosed in, for example, U.S. Pat. No. 5,621,022 and U.S. Pat. No. 5,231,135, the disclosures of each of which are hereby incorporated by reference herein in their entireties, and commercially available from, for example, Milliken & Company as Milliken Ink Yellow 869, Milliken Ink Blue 92, Milliken Ink Red 357, Milliken Ink Yellow 1800, Milliken Ink Black 8915-67, uncut Reactint® Orange X-38, uncut Reactint® Blue X-17, Solvent Yellow 162, Acid Red 52, Solvent Blue 44, and uncut Reactint® Violet X-80.

In embodiments, the colorant comprises a yellow dye. In other embodiments, the colorant comprises a black dye. In embodiments, the colorant is an azo pyridone colorant as described in U.S. Pat. No. 6,590,082, which is hereby incorporated by reference herein in its entirety. In embodiments, the colorant is a compound of the formula

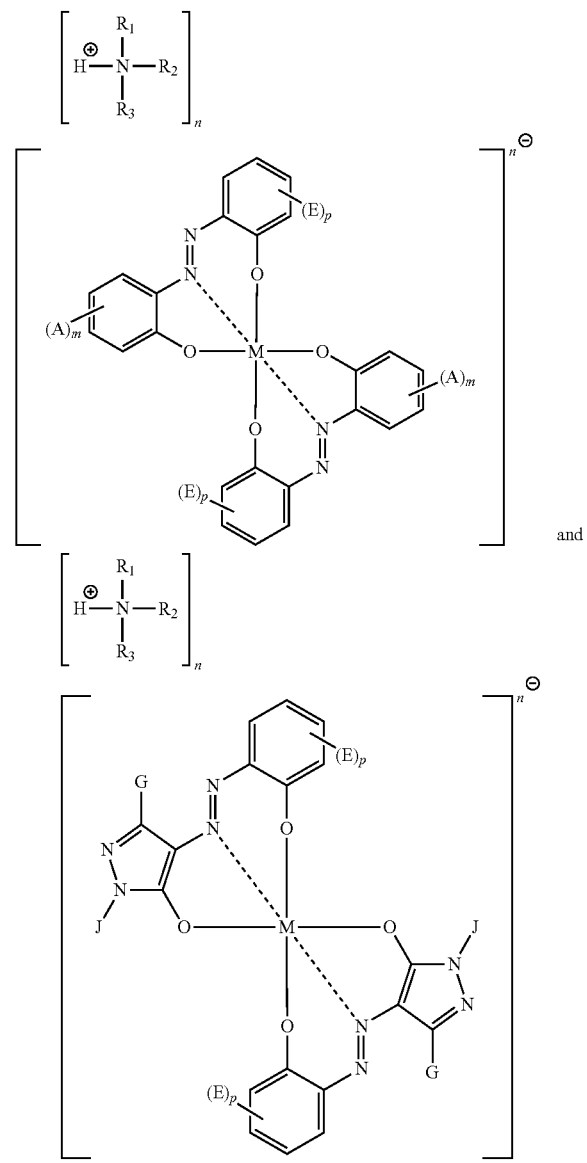

and wherein $R_1$, $R_2$, and $R_3$ each, independently of the others, is a hydrogen atom, an alkyl group, provided that the total number of carbon atoms and hetero atoms, if hetero atoms are present, excluding atoms in any substituents, in $R_1+R_2+R_3$ is at least about 18, M is a metal atom, Each A, each E, and each G, independently of the other, represents a substituent on a phenyl or pyrazolone ring, wherein G can also be a hydrogen atom, m is an integer of 0, 1, or 2, p is an integer of 0, 1, 2, 3, or 4, J represents a hydrogen atom, an alkyl groups, an aryl group, an arylalkyl group, or an alkylaryl group, wherein two or more substituents on the phenyl or pyrazolone rings can be joined together to form a ring, and n represents an integer of 1, 2, or 3, as described in U.S. Pat. No. 7,294,730, which is hereby incorporated by reference herein in its entirety.

The colorant is present in the ink in any desired or effective amount, in embodiments the colorant is present in an amount of from about 1 to about 60 percent, or from about 30 to about 40 percent, or from about 10 to about 25 percent by weight based upon the total weight of the ink.

The water dispersible phase change ink compositions here in optionally further comprise a synergist. Any suitable or desired synergist can be employed. In embodiments, a copper phthalocyanine derivative is employed as a synergist for improving dispersion stability of pigmented phase change inks.

The water dispersible phase change ink compositions herein can contain a dispersant. Any suitable or desired dispersant can be employed.

The dispersant can optionally be a polymeric dispersant such as those sold under the name Solsperse®, in embodiments, Solsperse® 1700, Solsperse® 32000, Solsperse® 13240, available from The Lubrizol Corporation.

The dispersant can be provided in the phase change ink composition in any suitable or desired amount. In embodiments, the dispersant can be present in an amount of from about 1 to about 500 percent, or from about 10 to about 300 percent, or from about 30 to about 200 percent total dispersant, based on the total weight of the pigment in the phase change ink composition.

The water dispersible phase ink compositions can be prepared by any desired or suitable method. For example, the ink ingredients can be mixed together, followed by heating, to a temperature of at least about 100° C. to no more than about 140° C., although the temperature can be outside of this range, and stirring until a homogeneous ink composition is obtained, followed by cooling the ink to ambient temperature (typically from about 20 to about 25° C.). The inks of the present disclosure are solid at ambient temperature. In a specific embodiment, during the formation process, the inks in their molten state are poured into molds and then allowed to cool and solidify to form ink sticks.

In embodiments, an ink jet printer stick or pellet herein comprises a water dispersible phase change ink composition as described herein. In embodiments, an ink jet printer stick or pellet comprises a water dispersible phase change ink composition, wherein the phase change ink composition comprises a hydrophilic wax having at least one ethoxyl moiety; a low viscosity wax having at least one hydroxyl group, wherein the low viscosity wax is miscible with the hydrophilic wax; an optional stabilizer, wherein the optional stabilizer, if present, is selected from the group consisting of hindered amine, phenol, aromatic amine antioxidant stabilizer, and mixtures and combinations thereof; and a colorant wherein the colorant is selected to absorb light in a region that one wants to block.

A water dispersible phase change ink composition is provided having a particular combination and relative ratio of selected components. In embodiments, the particular combination comprises a combination of both hydrophilic wax and low viscosity wax which is miscible with the hydrophilic wax, an optional stabilizer, in embodiments, an amide, and a colorant. The present inventors have found that this particular combination and ratio of ingredients provides improved properties of jetting reliability, improved durability after printing on lenses, printed images on the lenses which are easy to clean, can be removed with water, and provide good adhesion on both hydrophilic and hydrophobic lenses, and good optical contrast on both clear and dark lenses.

The inks disclosed herein can be employed in apparatus for direct printing ink jet processes and in indirect (offset) printing ink jet applications. Another embodiment is directed to a process which comprises incorporating an ink as disclosed herein into an ink jet printing apparatus, melting the ink, and causing droplets of the melted ink to be ejected in an imagewise pattern onto a recording substrate. A direct printing process is also disclosed in, for example, U.S. Pat. No. 5,195,430, the disclosure of which is totally incorporated herein by reference. The inks prepared as disclosed herein can be employed in apparatus for indirect (offset) printing ink jet applications. Another embodiment is directed to a process which comprises incorporating an ink prepared as disclosed herein into an ink jet printing apparatus, melting the ink, causing droplets of the melted ink to be ejected in an imagewise pattern onto an intermediate transfer member, and transferring the ink in the imagewise pattern from the intermediate transfer member to a final recording substrate. In a specific embodiment, the intermediate transfer member is heated to a temperature above that of the final recording sheet and below that of the melted ink in the printing apparatus. An offset or indirect printing process is also disclosed in, for example, U.S. Pat. No. 5,389,958, the disclosure of which is totally incorporated herein by reference. In one specific embodiment, the printing apparatus employs a piezoelectric printing process wherein droplets of the ink are caused to be ejected in imagewise pattern by oscillations of piezoelectric vibrating elements.

In embodiments, a method herein comprises incorporating into an ink jet printing apparatus a phase change ink composition as described herein; melting the ink composition; and causing droplets of the melted ink to be ejected in an imagewise pattern onto a substrate.

Ink jetting temperature can be any suitable or desired jetting temperature, in embodiments, jetting temperature being from about 50° C. to about 150° C. or from about 50° C. to about 140° C. or more typically from about 100° C. to about 140° C. The ink compositions generally have melt viscosities at the jetting temperature (in one embodiment no lower than about 50° C., in another embodiment no lower than about 60° C., and in yet another embodiment no lower than about 70° C., and in one embodiment no higher than about 150° C., and in another embodiment no higher than about 145° C., although the jetting temperature can be outside of these ranges) in one embodiment of no more than about 30 centipoise, in another embodiment of no more than about 20 centipoise, and in yet another embodiment of no more than about 15 centipoise, and in one embodiment of no less than about 2 centipoise, in another embodiment of no less than about 5 centipoise, and in yet another embodiment of no less than about 7 centipoise, in another embodiment, of greater than about $10^5$ centipoise at a temperature of less than about 40° C., in another embodiment, of less than about 15 centipoise at a temperature of no less than about 70° C., although the melt viscosity can be outside of these ranges.

In one specific embodiment, the inks are jetted at low temperatures, in particular at temperatures below about 150° C., in one embodiment from about 40° C. to about 150° C., in another embodiment from about 50° C. to about 145° C., and in yet another embodiment from about 60° C. to about 120° C., although the jetting temperature can be outside of these ranges.

In embodiments, the ink compositions herein are jetted onto an emulsion layer of a screen printing device. In embodiments, a process herein comprises disposing a water dispersible phase change ink composition onto a photosensitive emulsion film that is disposed on a screen to form a mask; wherein the water dispersible phase change ink composition comprises a hydrophilic wax having at least one ethoxyl moiety; a low viscosity wax having at least one hydroxyl group, wherein the low viscosity wax is miscible with the hydrophilic wax; an optional stabilizer, an optional amide; and a colorant, wherein the colorant is selected to absorb light in a region that one wants to block; exposing the mask to radiation to form a stencil; washing with water to remove the mask, leaving the photo-imaged stencil.

EXAMPLES

The following Examples are being submitted to further define various species of the present disclosure. These Examples are intended to be illustrative only and are not intended to limit the scope of the present disclosure. Also, parts and percentages are by weight unless otherwise indicated.

Inks. The ink example was prepared having the components provided in Tables 1. The inks were prepared by combining the components in the amounts shown in Table 1 in a beaker fitted with magnetic stirring and heating, heating to a temperature of about 130° C. and stirring for a period of about 2 hours. The inks were then filtered thru a 1 μm filter paper to give the desired ink.

TABLE 1

| Component | Example 1 Weight Percent |
|---|---|
| Behenyl Alcohol | 28.28 |
| Unithox ™ 550 | 65.99 |
| Black Dye | 5.33 |
| Naugard ® 445 | 0.4 |
| Total | 100 |

The behenyl alcohol, $CH_3(CH_2)_{20}CH_2OH$, low viscosity wax, was obtained as NACOL® 22-98, from Sasol North America Inc., Westlake, La.

Unithox™ 550, an ethoxylated hydrophilic wax of the formula $CH_3—(CH_2CH_2)_n—(CH_2CH_2O)_m—H$, obtained from Baker Hughes.

Black dye was prepared as described in Example 1 of U.S. Pat. No. 7,294,730, which is hereby incorporated by reference herein in its entirety, as follows. To a 2-liter 3-necked round bottom flask equipped with TEFLON® coated magnet, silicone oil bath, magnetically stirred hot plate, and condenser was charged 1,100 grams methyl isobutyl ketone (obtained from Aldrich Chemical Co.). Stirring was initiated and Solvent Black 45 free acid dye (about 250 grams, 0.275 moles), of the formula

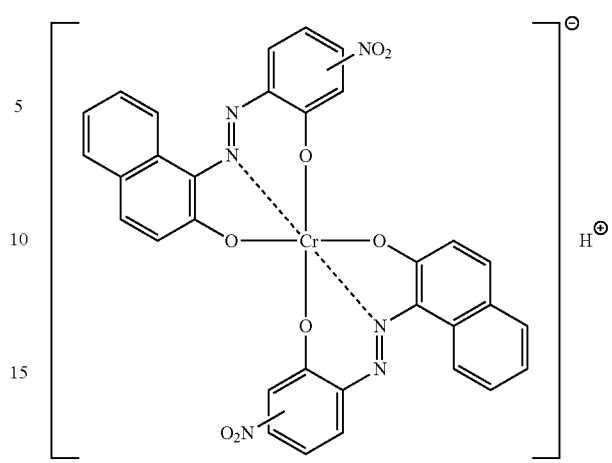

Was added to the flask. The oil bath was heated to 120° C. for about 2 hours until the dye was completely dissolved. About 196.3 grams (0.20 moles) of distearyl amine (ARMEEN® 2HT, Akzo Nobel) was subsequently added, and the reaction mixture was then refluxed for about 16 hours. A distillation setup was subsequently attached and the solvent was distilled off with the aid of a nitrogen inlet. When the distillation appeared complete, vacuum was applied to the system. The vacuum was gradually increased to prevent foaming and was held for about 16 hours at 120° C. The flask was then transferred to an oven at 120° and secured upside down, and the product was collected. The product was believed to be of the formula Naugard® 445 is an aromatic amine antioxidant stabilizer, 4,4'-Bis(α, α-dimethylbenzyl) diphenylamine, commercially available from Chemtura Corporation.

The ink was characterized as follows.

TABLE 2

| Ink Properties | Example 1 Weight Percent |
|---|---|
| Visc. at 110° C. | 14.20 |
| Visc. at 125° C. | 10.57 |
| Visc. at 130° C. | 9.58 |
| Spectral Strength in BuOH | |
| Unfiltered Ink at 579 nanometers | 1047 |

TABLE 2-continued

| Ink Properties | Example 1 Weight Percent |
|---|---|
| Unfiltered Ink at 381 nanometers | 903 |
| Filtered Ink at 579 nanometers | 1044 |
| Filtered Ink at 381 nanometers | 904 |
| DSC (° C.) | |
| Peak Melting Point | 67.4 |
| Peak Freezing Point | 60.5 |

The viscosity properties of the material were determined at using a 50 millimeter cone and plate geometry on an AR 1000 Rheometer, obtained from Rheometrics Corporation, now TA Instruments, Inc.

DSC: Melting point was measured by Differential Scanning calorimetry using a DuPont 2100 calorimeter at a scan rate of 10° C./minute.

Thermal stabilities of the inks were tested by cooking the inks in glass jars in an over at 125° C., and then monitoring the viscosity change. The results as shown in Table 3 illustrate very good thermal stability of the viscosity after cooking for up to 6 to 9 days at 125° C., which is a desirable feature for reliable jetting performance. Viscosity means centipoise at 110° C. and 125° C.

TABLE 3

| Example | Properties | Days at 125° C. | | | | |
|---|---|---|---|---|---|---|
| | | 0 | 1 | 2 | 4 | 5 |
| 1 | Visc. at 125° C. | 10.57 | 10.53 | 10.67 | 10.96 | 11.13 |

Further, the inks herein showed desirable Newtonian behavior for viscosity when scanning over different frequencies.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A water dispersible phase change ink composition comprising:
    a hydrophilic wax having at least one ethoxyl moiety;
    a low viscosity wax having at least one hydroxyl group, wherein the low viscosity wax is miscible with the hydrophilic wax;
    an optional stabilizer; and
    a colorant, wherein the colorant is selected to absorb light in a region that one wants to block.

2. The water dispersible phase change ink composition of claim 1, wherein the colorant is a colorant selected to absorb light in the visible range.

3. The water dispersible phase change ink composition of claim 1, wherein the colorant is a colorant selected to absorb light in the ultra violet range.

4. The water dispersible phase change ink composition of claim 1, wherein the colorant is a black dye selected to absorb light in the ultra violet range.

5. The water dispersible phase change ink composition of claim 1, wherein the hydrophilic wax is selected from the group consisting of ethoxylated hydrocarbon wax, ethoxylated alcohol, and mixtures and combinations thereof.

6. The water dispersible phase change ink composition of claim 1, wherein the low viscosity wax is a wax having a viscosity of from about 1 to about 15 centipoise at a temperature in the range of from about 80° C. to about 120° C.

7. The water dispersible phase change ink composition of claim 1, wherein the low viscosity wax is selected from the group consisting of stearyl alcohol, behenyl alcohol, and mixtures and combinations thereof.

8. The water dispersible phase change ink composition of claim 1, wherein the stabilizer is present and is selected from the group consisting of aromatic amine, hindered amine, phenol, and mixtures and combinations thereof.

9. The water dispersible phase change ink composition of claim 1, wherein the stabilizer is an aromatic amine antioxidant.

10. The water dispersible phase change ink composition of claim 1, wherein the colorant is selected from the group consisting of dyes, pigments, and mixtures and combinations thereof.

11. The water dispersible phase change ink composition of claim 1, wherein the water dispersible phase change ink composition forms an ultra violet mask.

12. An ink jet printer stick or pellet comprising a water dispersible phase change ink composition, wherein the phase change ink composition comprises:
    a hydrophilic wax having at least one ethoxyl moiety;
    a low viscosity wax having at least one hydroxyl group, wherein the low viscosity wax is miscible with the hydrophilic wax;
    an optional stabilizer, wherein the optional stabilizer, if present, is selected from the group consisting of aromatic amine, hindered amine, phenol, and mixtures and combinations thereof; and
    a colorant, wherein the colorant is selected to absorb light in a region that one wants to block.

13. The ink jet printer stick or pellet of claim 12, wherein the colorant is a colorant selected to absorb light in the visible range or the ultra violet range.

14. The ink jet printer stick or pellet of claim 12, wherein the colorant is a black dye selected to absorb light in the ultra violet range.

15. The ink jet printer stick or pellet of claim 12, wherein the ink jet printer stick or pellet forms an ultra violet mask.

16. The ink jet printer stick or pellet of claim 12, wherein the hydrophilic wax is selected from the group consisting of ethoxylated hydrocarbon wax, ethoxylated alcohol, and mixtures and combinations thereof.

17. The ink jet printer stick or pellet of claim 12, wherein the low viscosity wax is selected from the group consisting of stearyl alcohol, behenyl alcohol, and mixtures and combinations thereof.

18. A process comprising:
    disposing a water dispersible phase change ink composition onto a photo-sensitive emulsion film that is disposed on a screen to form a mask;

wherein the water dispersible phase change ink composition comprises a hydrophilic wax having at least one ethoxyl moiety; a low viscosity wax having at least one hydroxyl group, wherein the low viscosity wax is miscible with the hydrophilic wax; an optional stabilizer, and a colorant, wherein the colorant is selected to absorb light in a region that one wants to block;

exposing the mask to radiation to form a stencil; and washing with water to remove the mask, leaving the photo-imaged stencil.

19. The process of claim 18, wherein the hydrophilic wax is selected from the group consisting of ethoxylated hydrocarbon wax, ethoxylated alcohol, and mixtures and combinations thereof.

20. The process of claim 18, wherein the low viscosity wax is a wax having a viscosity of from about 1 to about 15 centipoise at a temperature in the range of from about 80° C. to about 120° C.

* * * * *